(12) United States Patent
Chen et al.

(10) Patent No.: US 8,735,950 B2
(45) Date of Patent: May 27, 2014

(54) TUNABLE SCHOTTKY DIODE WITH DEPLETED CONDUCTION PATH

(75) Inventors: Weize Chen, Phoenix, AZ (US); Xin Lin, Phoenix, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/605,357

(22) Filed: Sep. 6, 2012

(65) Prior Publication Data

US 2014/0061731 A1  Mar. 6, 2014

(51) Int. Cl.
*H01L 29/66* (2006.01)

(52) U.S. Cl.
USPC .................................. 257/272; 257/E29.265

(58) Field of Classification Search
CPC ............... H01L 27/00; H01L 27/0825; H01L 29/66143; H01L 29/872; H01L 27/0727; H01L 27/095; H01L 29/806; H01L 29/8083
USPC ........................... 257/272, E29.265; 438/186
See application file for complete search history.

(56) References Cited

U.S. PATENT DOCUMENTS

| | | | |
|---|---|---|---|
| 6,423,986 B1* | 7/2002 | Zhao | 257/138 |
| 7,064,407 B1 | 6/2006 | Mallikarjunaswamy | |
| 7,915,704 B2 | 3/2011 | Lin et al. | |
| 2006/0076613 A1* | 4/2006 | Ohyanagi et al. | 257/330 |
| 2010/0025693 A1* | 2/2010 | Malhan et al. | 257/76 |
| 2010/0301400 A1 | 12/2010 | Lin et al. | |

\* cited by examiner

*Primary Examiner* — Kimberly Rizkallah
*Assistant Examiner* — Duy T Nguyen
(74) *Attorney, Agent, or Firm* — Lempia Summerfield Katz LLC

(57) ABSTRACT

A device includes a semiconductor substrate, first and second electrodes supported by the semiconductor substrate, laterally spaced from one another, and disposed at a surface of the semiconductor substrate to form an Ohmic contact and a Schottky junction, respectively. The device further includes a conduction path region in the semiconductor substrate, having a first conductivity type, and disposed along a conduction path between the first and second electrodes, a buried region in the semiconductor substrate having a second conductivity type and disposed below the conduction path region, and a device isolating region electrically coupled to the buried region, having the second conductivity type, and defining a lateral boundary of the device. The device isolating region is electrically coupled to the second electrode such that a voltage at the second electrode during operation is applied to the buried region to deplete the conduction path region.

19 Claims, 12 Drawing Sheets

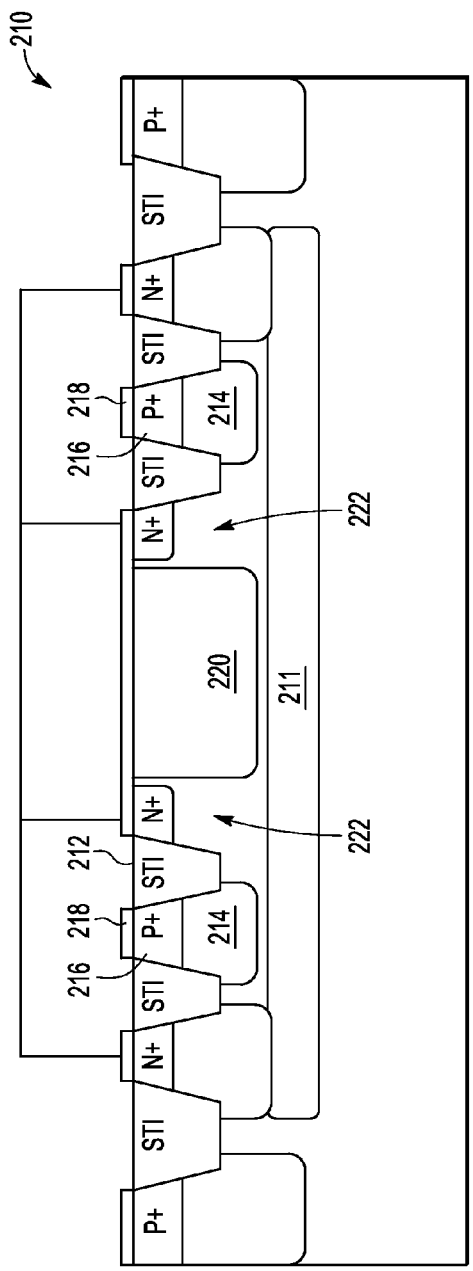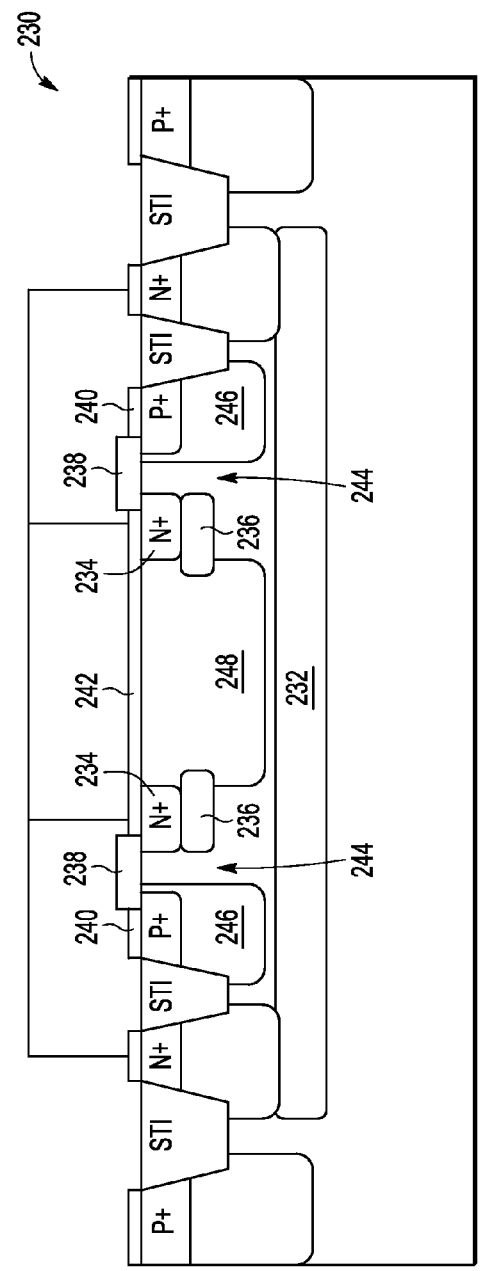

TUNABLE SCHOTTKY DIODE WITH DEPLETED CONDUCTION PATH

FIELD OF INVENTION

The present embodiments relate to semiconductor devices.

BACKGROUND

Integrated circuits (ICs) and other electronic apparatus often include arrangements of interconnected field effect transistor (FET) devices, also called metal-oxide-semiconductor field effect transistors (MOSFETs), or simply MOS transistors or devices. A control voltage applied to a gate electrode of the FET device controls the flow of current through a controllable conductive channel between source and drain electrodes.

Power transistor devices are designed to be tolerant of the high currents and voltages that are present in power applications such as motion control, air bag deployment, and automotive fuel injector drivers. One type of power transistor is a laterally diffused metal-oxide-semiconductor (LDMOS) transistor. Power transistor devices may have a number of features customized to prevent breakdown resulting from the high electric fields arising from such high voltages. The fabrication process flow is thus configured with a considerable number of steps directed to creating features specific to the high voltage FET devices. The steps may be highly customized to optimize the features of the high voltage devices, as well as any low voltage devices in the integrated circuit, such as complementary MOS (CMOS) logic devices.

The customization of the process flow may not be conducive to fabricating conventional designs of other semiconductor devices, such as Schottky diodes, present in the integrated circuit. Schottky diodes fabricated in CMOS process flows are typically formed with a silicide layer over an n-type or p-type crystalline silicon area. The resulting Schottky barrier junction has undesirably low breakdown voltage and high reverse leakage levels due to image force barrier lowering.

One attempt to address these deficiencies involves placing a depletion-mode LDMOS transistor device in series with the Schottky diode. Unfortunately, the LDMOS transistor device increases the footprint of the Schottky diode. The LDMOS transistor device may also involve incorporating additional procedures into the process flow, increasing the overall production cost of the integrated circuit.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIGS. 7-15 are cross-sectional, schematic views of exemplary Schottky diodes, each having an integrated JFET device, in accordance with various embodiments.

DETAILED DESCRIPTION OF THE PRESENTLY PREFERRED EMBODIMENTS

Figure 1:
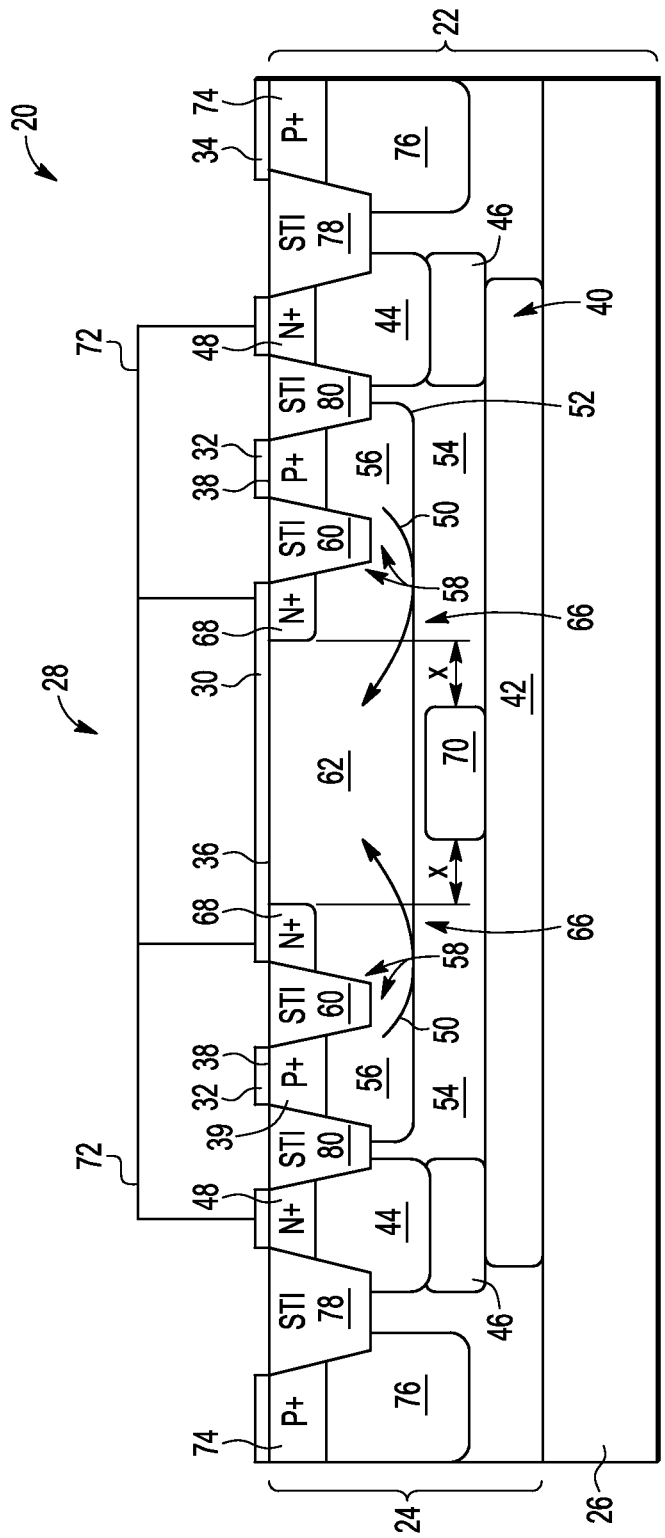
FIG. 1 is a cross-sectional, schematic view of an exemplary Schottky diode having an integrated junction field-effect transistor (JFET) device in accordance with one embodiment.

Schottky diodes having an integrated, tunable JFET device are described. Methods of fabricating such Schottky diodes are also described. The integrated JFET device clamps or constricts a conduction path of the Schottky diode in a non-lateral direction (e.g., a diagonal or vertical direction) when the Schottky diode is reverse biased. The JFET devices are integrated to control, decrease or minimize the reverse leakage level of the disclosed Schottky diodes by depleting the conduction path. The JFET devices may also improve the breakdown voltage level of the disclosed Schottky diodes because a considerable fraction of the bias voltage is disposed across the depleted channel of the JFET device. The Schottky barrier junction need not bear the full burden of the bias voltage.

The integrated JFET device may include upper and lower gates or gate arrangements above and below the conduction path. The upper or top gate may be disposed at a substrate surface in a cathode contact-landing region or area. The lower or bottom gate is electrically coupled or tied to an electrode, e.g., cathode, of the Schottky diode and the upper gate via one or more device isolating regions, e.g., an isolation tub. The coupling may also include a metal layer connection provided via, e.g., backend metallization. The upper and lower gates may be laterally offset from one another or laterally overlap one another.

The integrated JFET devices are tunable to adjust the conductivity of the JFET device during a forward conduction state of the Schottky diode. The adjustment(s) may be implemented via a change to one or more mask layouts. The adjustment need not add or otherwise alter existing process steps. The disclosed Schottky diodes may be configured to present a low forward voltage drop, low reverse leakage, and high breakdown voltage.

The disclosed Schottky diodes and integrated JFET devices may be fabricated using process steps directed to fabricating other devices, such as FET devices. Implantation procedures used to form various regions or structures of power and/or logic FET devices may be used. The disclosed Schottky diodes may thus achieve the above-referenced operational advantages while avoiding additional fabrication process costs.

Although described below in connection with substrates having epitaxially grown layers, the disclosed devices and fabrication methods are not limited to any particular substrate type or fabrication technology. The substrate may be configured as a silicon-on-insulator (SOI) substrate. The semiconductor substrates of the disclosed devices may vary. For example, materials other than silicon may be used. The configuration, depth, construction, materials and other characteristics of the epitaxial layer(s) may also vary.

Although described below in connection with p-type diodes and conduction paths, the disclosed devices are not limited to any particular diode, transistor, or other device configuration. P-type diodes and conduction paths are described and illustrated herein for convenience of description and without any intended limitation. N-type diodes and conduction paths may be provided by, for example, substitution of semiconductor regions of opposite conductivity type. Thus, for example, each semiconductor region, layer or other structure in the examples described below may have a conductivity type, e.g., n-type or p-type, opposite to the type identified in the examples below.

FIG. 1 is a schematic cross-sectional view of an example of a semiconductor device 20 configured as a Schottky diode and constructed in accordance with one embodiment. The device 20 includes a semiconductor substrate 22, which may, in turn, include a number of epitaxial layers 24. In this example, the semiconductor substrate 22 includes a single p-type epitaxial layer 24 grown on an original substrate 26. The original substrate 26 may be a lightly or heavily doped p-type substrate. The device 20 may alternatively or additionally include non-epitaxial layers in which one or more device regions are formed. Any one or more of the layers of the semiconductor substrate 22 may include silicon.

The structural, material, and other characteristics of the semiconductor substrate 22 may vary from the example shown. Additional, fewer, or alternative layers may be included in the semiconductor substrate 22. For example, any number of additional semiconductor and/or non-semiconductor layers may be included. The disclosed devices are thus not limited to, for instance, bulk or SOI substrates, or substrates including epitaxially grown layers, and instead may be supported by a wide variety of other types of semiconductor substrates.

A device area 28 is depicted in the embodiment of FIG. 1. The structures, regions, and other elements of the device 20 in the device area 28 are symmetrical about an inner electrode 30 laterally centered within the device area 28. In this example, the inner electrode 30 is configured as a cathode. The inner electrode 30 is disposed between a pair of outer electrodes 32. In this example, the outer electrodes 32 are configured as anodes. The electrodes 30, 32 are laterally spaced from one another and disposed at a surface 34 of the semiconductor substrate 22. The inner electrode 30 is configured to form a Schottky barrier junction 36 at the surface 34, while the outer electrodes 32 are configured to form Ohmic contacts 38 at the surface 34. Each Ohmic contact 38 is established by a heavily doped p-type contact region 39 in the semiconductor substrate 22 at the surface 34.

In embodiments having, for instance, an n-type semiconductor substrate or epitaxial layer, the arrangement of the anode and cathode may be switched from the example of FIG. 1. For instance, the location or configuration of the electrodes 30, 32 may be modified in embodiments having, for instance, an n-type epitaxial layer. The device 20 need not be symmetrical or include more than one anode or cathode. The device 20 may be configured as a single Schottky diode having a single anode and a single cathode.

Each electrode 30, 32 may include a silicide structure or layer. A variety of silicide materials may be used. Examples of suitable silicide materials include titanium silicide, colbalt silicide, nickel silicide, and tungsten silicide. In non-silicon and other embodiments, one or more of the electrodes 30, 32 may be formed using conductive materials other than silicide materials, such as tungsten.

The outer electrodes 32 may be driven or controlled collectively or individually. With the outer electrodes 32 electrically tied to one another, the device 20 is configured as a single Schottky diode. The device 20 may be configured as a pair of Schottky diodes when the outer electrodes 32 are not electrically tied to one another.

The device area 28 may be defined by one or more doped device isolating layers or regions in the semiconductor substrate 22, e.g., the epitaxial layer 24. The doped device isolating layer(s) or region(s) may laterally and/or vertically surround the device area 28. For example, the device isolating layer(s) or region(s) may collectively form a device isolation tub 40 of the device 20. Sidewalls of the device isolation tub 40 are disposed about a lateral periphery or border of the device area 28. A bottom of the device isolation tub 40 extends laterally across and under or below the structures, regions, or other components of the device 20 in the device area 28. The layers or regions of the isolation tub 40 may be configured as barriers separating the device area 28 from the rest of the substrate 22 (or the original substrate 26). Such barriers may be useful for preventing breakdown during, e.g., high-side operation of the device 20. In this example, the isolation tub 40 includes an n-type buried layer (NBL) 42, an n-type isolating well or sink 44, and one or more link regions 46 disposed between the NBL 42 and the device isolating well 44 to link or join the layers or regions of the isolation tub 40.

Each of these layers and regions of the isolation tub 40 are electrically tied or coupled to one another. The layers and regions may thus be biased at a common voltage. In this example, the bias voltage is provided to the device isolating well 44 and the NBL 42 via one or more contact regions 48. One or more of the above-described device isolating regions may have a dopant concentration level and/or be otherwise configured for high voltage (HV) operation, e.g., high side operation in which the terminals of the device 20 are level shifted relative to the semiconductor substrate 22, which is typically grounded, including punch-through prevention.

In addition to device isolation function, the layers and/or regions of the isolation tub 40 are used to support the formation of an integrated JFET device. As described further below, the NBL 42 (and/or a region coupled thereto) may form part of an integrated JFET device configured to deplete one or more conduction paths 50 of the device 20. The NBL 42 and other regions or layers coupled thereto are biased at a voltage that corresponds with the voltage at the inner electrode 30, e.g., cathode. When the Schottky barrier junction 36 at the inner electrode 30 is reverse biased, the voltage at the inner electrode 30 is provided to one or more gates of the JFET device to deplete the conduction path(s) 50 of the device 20. The resulting depletion region may extend completely across the conduction path 50 in some reverse bias operational conditions, thereby reducing leakage current. The presence of the depletion region also allows a considerable amount of the reverse bias to be placed across the depletion region rather than solely across the Schottky barrier junction 36.

The NBL 42 is formed or disposed in the epitaxial layer 24 of the semiconductor substrate 22. The NBL 42 extends laterally across (e.g., under) the device area 28 of the device 20. The NBL 42 may be configured as a vertical barrier separating the active area 28 from the original substrate 26. The position of the NBL 42 relative to the original substrate 26 may vary. For example, the NBL 42 may be disposed closer to the surface 34 of the semiconductor substrate 22 and thus spaced from the original substrate 26.

The device 20 may include multiple doped isolating regions laterally surrounding the device area 28 or otherwise defining a lateral periphery or boundary of the device 20. In this example, the device area 28 is defined laterally by the device isolating well or sink 44. The device isolating well 44 may be ring-shaped. Alternative or additional device isolating regions may be included to define the lateral extent of the device area 28. Such regions need not be configured as doped regions, but instead be configured as insulator regions, such as shallow trench isolation (STI) regions. The isolating well 44 may be a moderately or heavily doped n-type region laterally surrounding the device area 28. The isolating well 44 may be disposed on or otherwise above the NBL 42 and outside of, or along, the lateral periphery of the device area 28 as shown. In some cases, an implant straggle and/or subsequent heat during the process flow leading to lateral and/or vertical diffusion may be used to form a continuous isolation tub. The isolating well 44 may be coupled to the NBL 42 via the link region(s) 46. The link region 46 may be ring-shaped, e.g., matching the shape of the isolating well 44, or be otherwise configured to form the isolation tub 40 and/or connect the NBL 42 and the isolating well 44. In other embodiments, the isolating well 44 may be contiguous with the NBL 40.

The device isolating regions and/or layers need not be configured or shaped as an isolation tub. For example, the isolating well 44 need not be ring-shaped or extend laterally around the entire periphery of the device 20. Other device isolating regions along the lateral boundary may be used. Along the bottom of the device 20, buried device isolating layers other than the NBL 42 may be used. For example, a buried device isolating layer need not extend entirely across one or both of the lateral dimensions of the device area 28. A continuous isolation tub may nonetheless remain possible, insofar as one or more implant straggles and/or subsequent heat may be relied upon to close a gap(s), e.g., between the NBL and one or more other regions, such as a gate region 70 described below. Additional, fewer, or alternative isolation layers or regions may be provided in the semiconductor substrate 22. For example, an SOI substrate may be used to provide isolation, e.g., between the anode and the substrate, via a buried dielectric layer.

The conduction paths 50 between the electrodes 30, 32 are schematically shown in FIG. 1. A forward conduction state of the Schottky diodes is depicted. In this example, the conduction paths 50 run laterally inward from the outer electrodes 32 toward the inner electrode 30. The conduction paths may also apply to the path along which any leakage current between the electrodes 30, 32 may flow, albeit in a direction opposite to that shown. The conduction paths 50 may not be solely laterally oriented, and may also include one or more changes in depth within the semiconductor substrate 22. With the inner electrode 30 as the cathode, the conduction paths 50 are oriented in the directions shown. The directions are reversed in devices having an inner anode. The conduction paths 50 are disposed in respective conduction path regions of the device 20. The conduction path regions may include one or more doped regions in the semiconductor substrate 22 disposed along the conduction path. For example, each conduction path region may include or correspond with portions of a p-type well 52 and/or a section 54 of the epitaxial layer 24 disposed between the NBL 42 and the p-type well 52. In this embodiment, the conduction path region includes several sections of the p-type well 52. Each conduction path begins near one of the outer electrodes 32 in an outer section 56, and continues through a buried section 58, passing around and below an isolation trench 60, e.g., a shallow trench isolation (STI) region. Each conduction path 50 then approaches the surface 34, passing through a central section or inner section 62 before reaching the Schottky barrier junction 36. Some of the charge carriers moving along the conduction paths 50 may pass through the section 54 of the epitaxial layer 24. In this example, the p-type well 52 extends laterally from each of the outer electrodes 32 to the inner electrode 30. The p-type well 52 may extend across the entire lateral width of the active area 28 of the device 20.

The NBL 42, the device isolating well 44, and the link region 46 may be considered regions or components of an integrated JFET structure 66 (or structural arrangement or device). In this embodiment, the device 20 includes a pair of JFET structures 66, one for each conduction path 50. Each JEFT structure 66 is oriented and configured such that the respective conduction path 50 and, thus, the conduction path region, of each Schottky diode is configured as a channel of the JFET structure 66. Control, e.g., constriction, and configuration of the JFET channel may thus be used to configure the Schottky diode(s) of the device 20.

Each JFET structure 66 includes one or more upper gate regions 68 and one or more lower gate regions 70. One or more of the upper gate regions 68 may be disposed at the surface 34 of the semiconductor substrate 22. In this example, the upper gate regions 68 are disposed along each side or end of the inner electrode 30. One or more of the lower gate regions 70 may be a buried region disposed below the surface 34. In this example, the JFET structure 66 includes a single, central lower gate region 70 disposed under or below the conduction path 50 (or the regions in the semiconductor substrate 22 forming the conduction path 50). The conduction paths 50 thus pass between the upper and lower JFET gate regions 68, 70, respectively. In some cases, the NBL 42 may additionally or alternatively serve as a lower gate region, including cases in which the NBL 42 is positioned at a shallower depth than the example of FIG. 1.

The upper and lower gate regions 68, 70 are n-type doped regions of the semiconductor substrate 22. In this example, the upper gate regions 68 are heavily doped regions. The upper and lower gate regions 68, 70 may have different dopant concentration levels. For example, the lower gate region 70 may be formed via an implantation procedure that also forms the link region(s) 46. The lower gate region 70 may thus have a dopant concentration level and profile (e.g., depth, etc.) in common with the link region(s) 46. The upper gate regions 68 may be formed via, for example, an implantation procedure configured to form source/drain regions of FET devices, such as LDMOS or CMOS devices.

Like the link region(s) 46, the lower gate region 70 is contiguous with the NBL 42. The lower gate region 70 and the NBL 46 are thus biased at the same voltage. The NBL 46, in turn, is electrically tied to the voltage at the inner electrode 30 via a path established by the isolation tub 40, e.g., the link region 46, the device isolating well 44 (or other device isolating region), and the contact region 48. Outside of the semiconductor substrate 22, the path may include one or more metal or other conductive lines 72 supported by the semiconductor substrate 22. The lines 72 electrically tie the isolation tub 40 (and the regions and layers thereof) to the inner electrode 30, e.g., cathode, which, in turn, is applied to the upper gate regions 68. A voltage at the inner electrode 30 during operation is thus applied to the lower gate region 70 to deplete the conduction path region(s) along the conduction path 50. The voltage at the inner electrode 30 is also applied to the upper gate regions 68 because an Ohmic contact is formed between the n-type semiconductor material of the upper gate regions 68 and the silicide or other conductive material of the inner electrode 30. With the contributions from both above and below, the depletion may thus extend across the gap between the upper and lower gate regions 68, 70 during a reverse bias operating condition.

The lower gate region 70 is buried in the semiconductor substrate 22 between the central section 62 of the well 52 and the NBL 42. The lower gate region 70 may be referred to as a buried gate region or gate of the JFET structure(s) 66. Such buried positioning (and resulting vertical separation of the gate regions 68, 70) allows the gates of the integrated JFET structures 66 to act on or control the conduction path 50 in a non-lateral direction. In this example, the non-lateral direction or orientation of the JFET structures 66 is diagonal. In other embodiments, the gates are configured to act on the conduction paths vertically.

The vertical separation of the gate regions 68, 70 may vary. A portion of the epitaxial layer 24 may be disposed between the well 52 and the lower gate region 70. The thickness of the portion of the epitaxial layer 24 may vary based on the overall thickness of the epitaxial layer 24. The overall thickness of the epitaxial layer 24 may not be adjustable solely to configure the integrated JFET structures 66, as it may be a parameter customized for other devices, e.g., LDMOS or CMOS devices, fabricated in the process flow. The integrated JFET structures 66 may nonetheless be configurable and tunable via adjustments to one or more of the layouts, e.g., masks, used to form the gate regions 68, 70 and other structures of the device 20.

The lower gate region 70 is laterally centered in the device area 28 and thus also centered between the upper gate regions 68. In this embodiment, the lower gate region 70 is laterally spaced from the upper gate regions 68. The lower gate region 70 is separated laterally from each upper gate region 68 by a gap having a size or lateral separation distance x as shown. The lateral separation may be selected to configure the device 20 to achieve a desired amount of depletion under a given reverse bias operating condition. Decreasing the lateral separation increases the extent to which the conduction path region(s) are depleted, thereby reducing leakage current and increasing the breakdown voltage level. The lateral separation may also be selected to achieve a desired forward conduction performance level. An increased separation increases the amount of p-type charge carriers in the conduction path region(s) and/or otherwise available along the conduction path 50. The lateral separation may thus be selected to tune the integrated JFET structures 66 and configure the Schottky diode(s) of the device 20.

The conductivity of the JFET channels may thus be adjusted by mask layout without the need to add steps to, or otherwise alter, an existing fabrication process flow. The current-voltage (I-V) characteristic of the Schottky diode(s) of the device 20 may thus be tuned by the spacing between the upper and lower gate regions 68, 70 without process changes. Such tuning is provided without any increased complexity or cost in fabrication.

The Schottky diode(s) of the device 20 need not be formed via process flows having an implant directed to forming the NBL 42. For example, the disclosed devices are compatible with process flows having an implant for another type of deep or buried n-type well that may be used for isolation. In such cases, the link layer 46 may not be present. The buried n-type well may also be used as the lower gate region 70. A variety of process technologies may be used to form the device 20, including, for example, standard CMOS, CMOS/analog, CMOS/flash, and CMOS/RF technologies.

FIG. 1 depicts a number of additional structures or regions to support the operation of the device 20. Outside of the device area 28, the semiconductor substrate 22 may be biased via one or more substrate contact regions 74. Each substrate contact region 74 may be disposed within a respective p-type well 76 and separated from the isolation contact regions 48 by respective isolation trenches 78, such as STI regions. STI regions or other isolation trenches 80 may be disposed between the isolation contact regions 48 and the outer electrodes 32. Each of the above-described contact regions may have a silicide or other conductive structure in a contact landing area at the surface 34 of the semiconductor substrate 22. In some embodiments, one or more of the isolation trenches 78 may be replaced by a silicide blocking layer.

The device 20 is shown in simplified form and, thus, FIG. 1 does not show all of the metal and passivation layers configured for electrical connections to, for instance, the outer electrodes 32 and other device structures. The device 20 may have a number of other structures or components for connectivity, isolation, and other purposes not shown in FIG. 1 for ease in illustration. For instance, the device 20 may include any number of additional isolating regions or layers. In some examples, another p-type epitaxial layer (not shown) may be disposed between the original substrate 26 and the active area 28. One or more further STI regions, other isolation trenches, and/or isolation wells (not shown) may be provided to isolate the active area 28 and/or other region of the device 20.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| p-epi 24: | $1 \times 10^{15}/cm^3$ | 5 μm |
| substrate 26: | $1 \times 10^{15}/cm^3$ | not applicable |
| contacts 38: | $1 \times 10^{21}/cm^3$ | 0.25 μm |
| NBL 42 | $5 \times 10^{18}/cm^3$ | 1 μm |
| well 44: | $1 \times 10^{17}/cm^3$ | 1.2 μm |
| link 46: | $1 \times 10^{17}/cm^3$ | 3 μm |
| contact 48: | $1 \times 10^{21}/cm^3$ | 1 μm |
| well 52: | $3 \times 10^{16}/cm^3$ | 0.7 μm |
| contacts 68: | $1 \times 10^{21}/cm^3$ | 0.25 μm |
| well 76: | $2 \times 10^{17}/cm^3$ | 1.2 μm |

The concentrations and thicknesses may be different in other embodiments. For example, the dopant concentration of the original substrate 26 may vary considerably.

Figure 2:
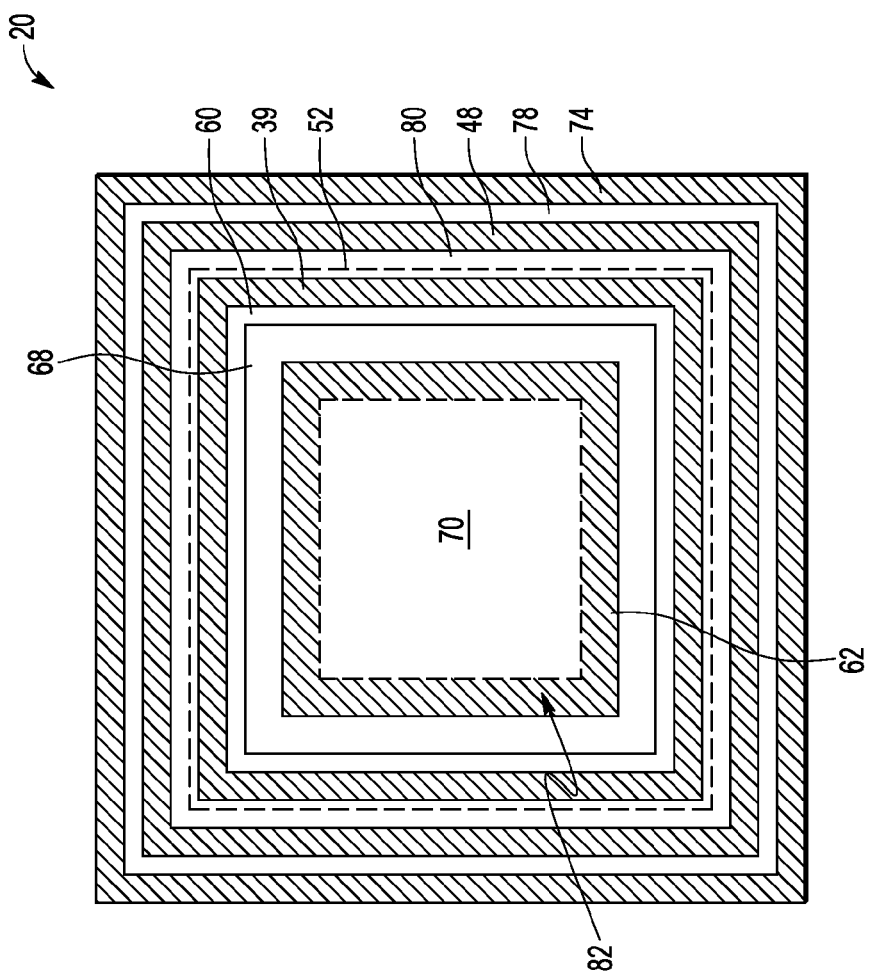
FIG. 2 is a top view of the Schottky diode of FIG. 1.

FIG. 2 schematically depicts an exemplary layout for the device 20. In this example, the device area 28 is square-shaped when viewed from above. The device 20 may thus be symmetrical in both lateral dimensions. For instance, a number of the above-described structures and regions are square-shaped rings or square-shaped when viewed from above as a result of the symmetry. The device 20 is shown without any silicide or other conductive structures or layers to depict the structures and regions in the semiconductor substrate 22.

The substrate contact region 74 and the isolation trench 78 surround the regions disposed within the device area 28. The device isolating well 44 (FIG. 1) is disposed inside and adjacent the isolation trench 78. The contact region 48 and the device isolating well 44 are ring-shaped in this embodiment, thereby defining each side or boundary of the periphery of the device area 28. The link region(s) 46 are disposed below the device isolating well 44 and are thus not shown. The isolation trench 80 separates the device isolating well 44 and the contact region 39 for the outer electrode 32, e.g., anode. The p-type well 52 terminates under the isolation trench 80. A border of the p-type well 80 is thus depicted with dashed lines within the ring-shaped area of the isolation trench 80.

The contact region 39 defines the anode active area of the device 20. In this example, the anode active area is ring-shaped and completely surrounds the n-type upper gate region 68 and an inner Schottky barrier area 82. The isolation trench 60 separates the anode active area and the upper gate region 68. The upper gate region 68 is ring- or donut-shaped, such that the device 20 is configured as a single Schottky diode. Centered within the device area 28 is the lower gate region 70, which is spaced from the upper gate region 68 by the central or inner section 62 of the p-type well 52. The width of the portion of the central section 62 viewable in FIG. 2 corresponds with the above-referenced distance x shown in FIG. 1.

The layout may vary from the example shown. Alternative layouts may exhibit lateral symmetry in one or both lateral dimensions. In one example, one or more of the ring-shaped regions or structures are instead configured as U-shaped regions or structures. The device 20 may nonetheless have a square-shaped layout. The shape of the regions and structures may vary considerably in various non-square-shaped layouts. Other layouts may not include lateral connections of one or more of the regions or structures along the lateral dimension shown in FIG. 1. In such cases, the layout may still, but need not, be symmetrical in both lateral directions. The layout may present a pair of integrated JFET structures for one or two Schottky diodes (depending on the metal connections).

Figure 3:
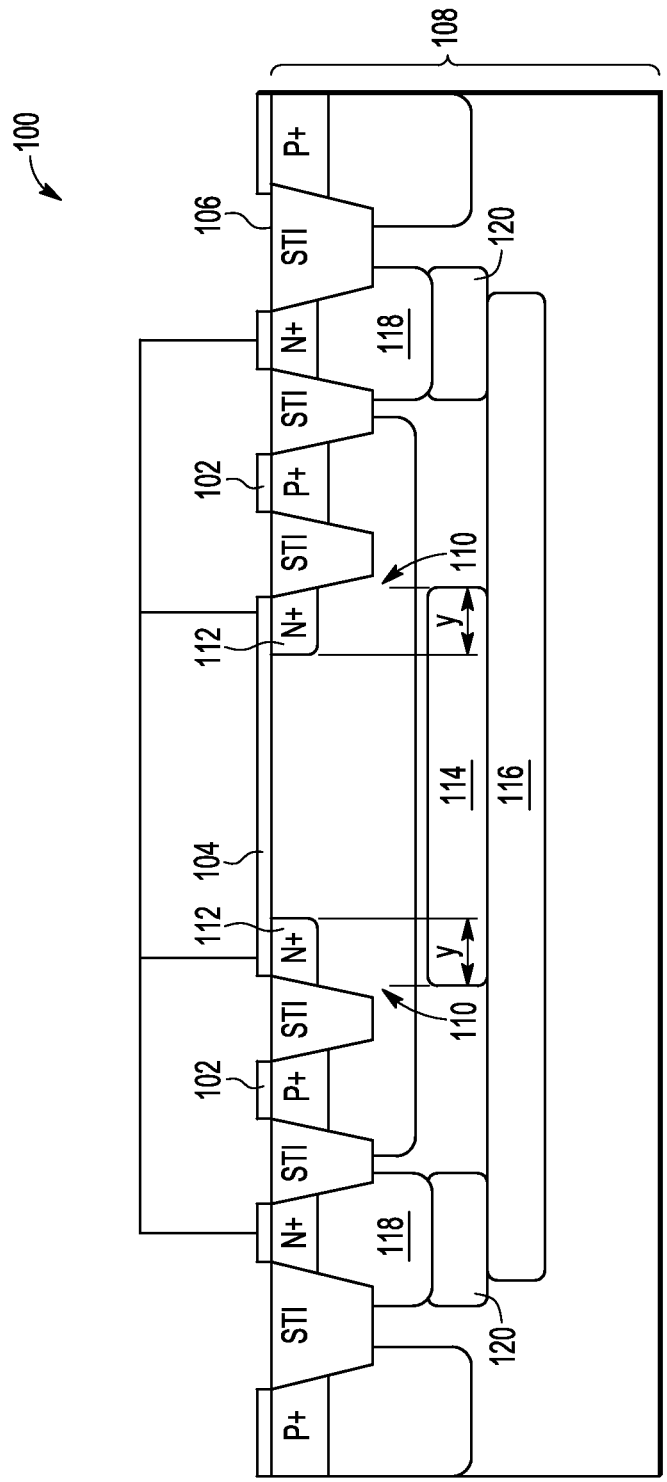
FIG. 3 is a cross-sectional, schematic view of another exemplary Schottky diode having an integrated JFET device in accordance with one embodiment.

FIG. 3 shows another exemplary Schottky diode 100 fabricated and configured in accordance with one or more aspects of the disclosure. The diode 100 has a lateral orientation with outer and inner electrodes 102, 104 spaced from one another at a surface 106 of a semiconductor substrate 108. The diode 100 thus has a lateral conduction path similar to the embodiments described above. The diode 100 also includes an integrated JFET structure 110 configured with upper and lower gate regions 112 and 114 in a manner similar to the embodiments described above. The upper gate region 112 is disposed at the surface 106 laterally adjacent to the inner electrode 104. The lower gate region 114 is buried in the semiconductor substrate 108 between the conduction path and a buried device isolating layer 116. The buried device isolating layer 116 is linked to a device isolating well 118 by a link region 120. The lower gate region 114 and the link region 120 may be formed via a common implant as described above.

The diode 100 differs from the above-described embodiments in the configuration of the integrated JFET structure 110. In this embodiment, the upper and lower gate regions 112 and 114 laterally overlap one another. The overlap in this example has a width y on either side of the diode 100. The overlap may also be present in the other lateral dimension, as in an embodiment having a square-shaped layout similar to the one shown in FIG. 2. The overlap may orient the JFET structure 110 vertically rather than diagonally. The overlap need not correspond with the width of the upper gate region 112 as shown. The lateral width of the lower gate regions in the embodiments of FIGS. 1-3 may vary.

The overlap may increase the proximity of the upper and lower gate regions 112 and 114. The increased proximity may, in turn, increase the extent to which the conduction path of the device 100 is depleted of charge carriers. The more extensive depletion region may increase the breakdown voltage and decrease the leakage current for the device 100. However, the increased presence of the oppositely doped gate regions 112 and 114 may reduce the number of charge carriers for forward conduction. The resulting decrease in conductivity is the tradeoff for the improvements in the breakdown voltage and leakage current levels.

FIGS. 4-7 present embodiments in which an JFET structure has a ring-shaped lower or buried gate region to decrease or minimize the overall amount of p-type doped material near the diode conduction path. The presence and location of the lower gate region remains directed to depleting the conduction path as described above. The ring shape attempts to achieve such depletion while maintaining a desired conductivity level.

Figure 4:
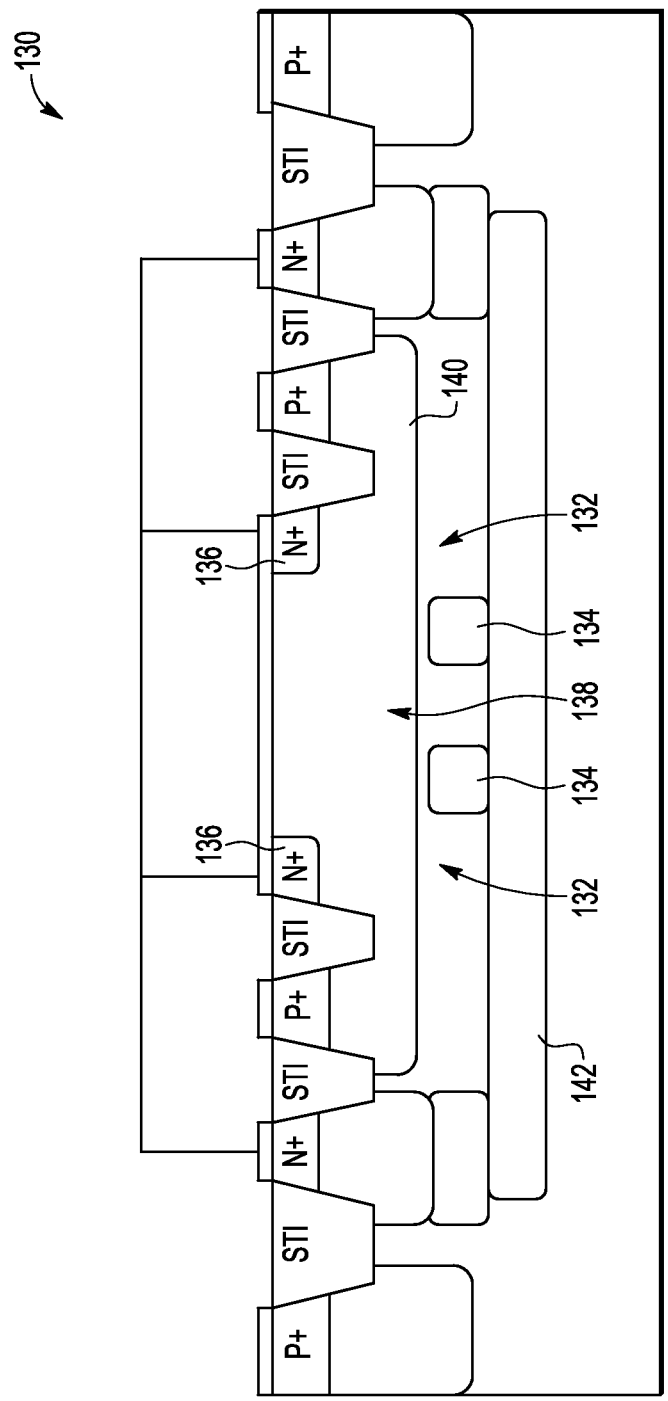
FIG. 4 is a cross-sectional, schematic view of another exemplary Schottky diode having an integrated JFET device with a ring-shaped lower gate in accordance with one embodiment.
Figure 5:
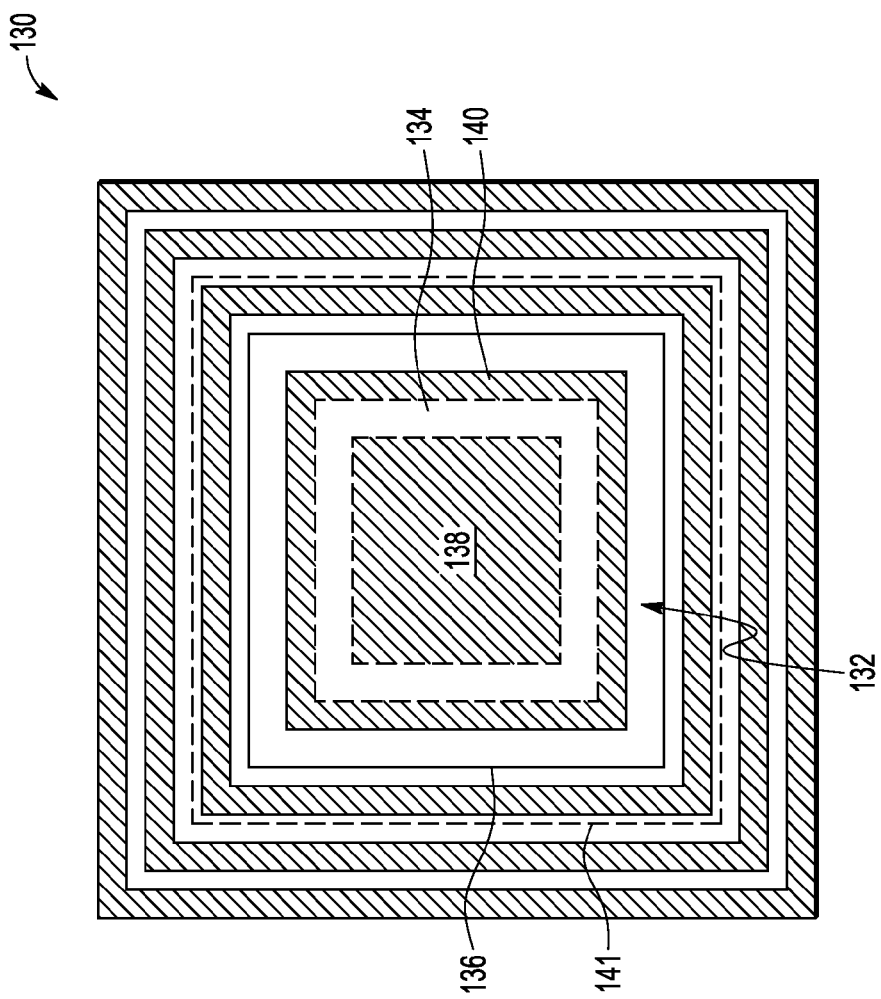
FIG. 5 is a top view of the Schottky diode of FIG. 4.

As shown in FIGS. 4 and 5, a Schottky diode 130 includes an integrated JFET structure 132 having a ring-shaped lower or buried gate region 134. The JFET structure 132 also includes an upper gate region 136, which may be configured in a manner similar to the upper gate regions of the embodiments described above. In this example, the lower gate region 132 is laterally spaced from the upper gate region 134, although other lateral locations may be used. The ring shape of the lower gate region 134 is shown more clearly in FIG. 5. The ring shape of the lower gate region 132 means that the area directly under or below a central or inner portion 138 of a p-type well 140 (an outer edge 141 of which is shown via dashed line) of the Schottky diode 130 is not doped n-type until the depth of a buried device isolating layer 142 (FIG. 4) is reached. The presence of the central or inner portion 138 increases the availability of majority charge carriers for use during operation in forward conduction mode.

The other regions, structures, and other components of the device 130 may be similarly configured to the above-described embodiments. Any optional modifications to such components may also be applied to the device 130. Any feature or aspect of an embodiment described herein may be incorporated into any other embodiment of the disclosure.

Figure 6:
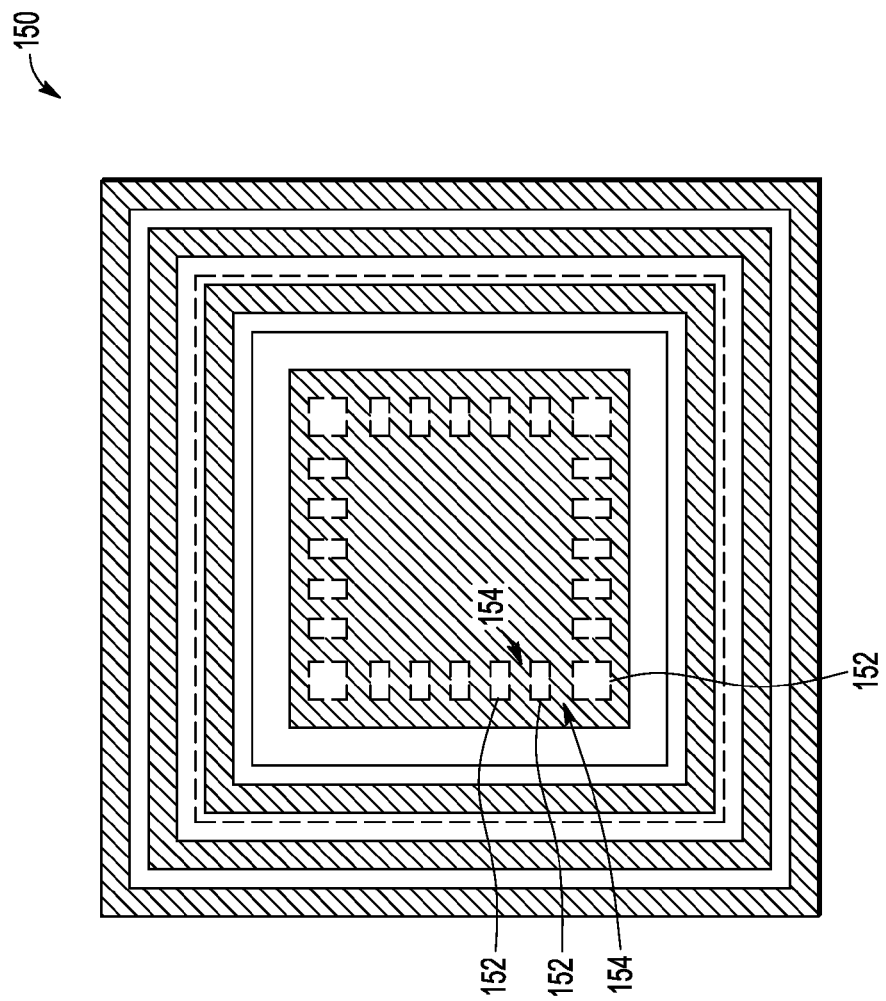
FIG. 6 is a top view of yet another exemplary Schottky diode having an integrated JFET device with a lower gate structure with a plurality of buried islands in accordance with one embodiment.

FIG. 6 is a top view of another Schottky diode 150 in which the potential influence of a lower gate structure is further controlled or tuned by patterning the ring into a set of buried gate islands 152. The buried gate islands 152 may be distributed over an area similar to the area of the lower gate region 134 shown in FIG. 5. The buried gate islands 152 are spaced from one another by respective gaps 154 between adjacent islands 152. The widths of the islands 142 and/or the respective gaps 154 may be adjusted to achieve a desired level of influence on the Schottky barrier and/or a desired forward conduction level.

Figure 7:
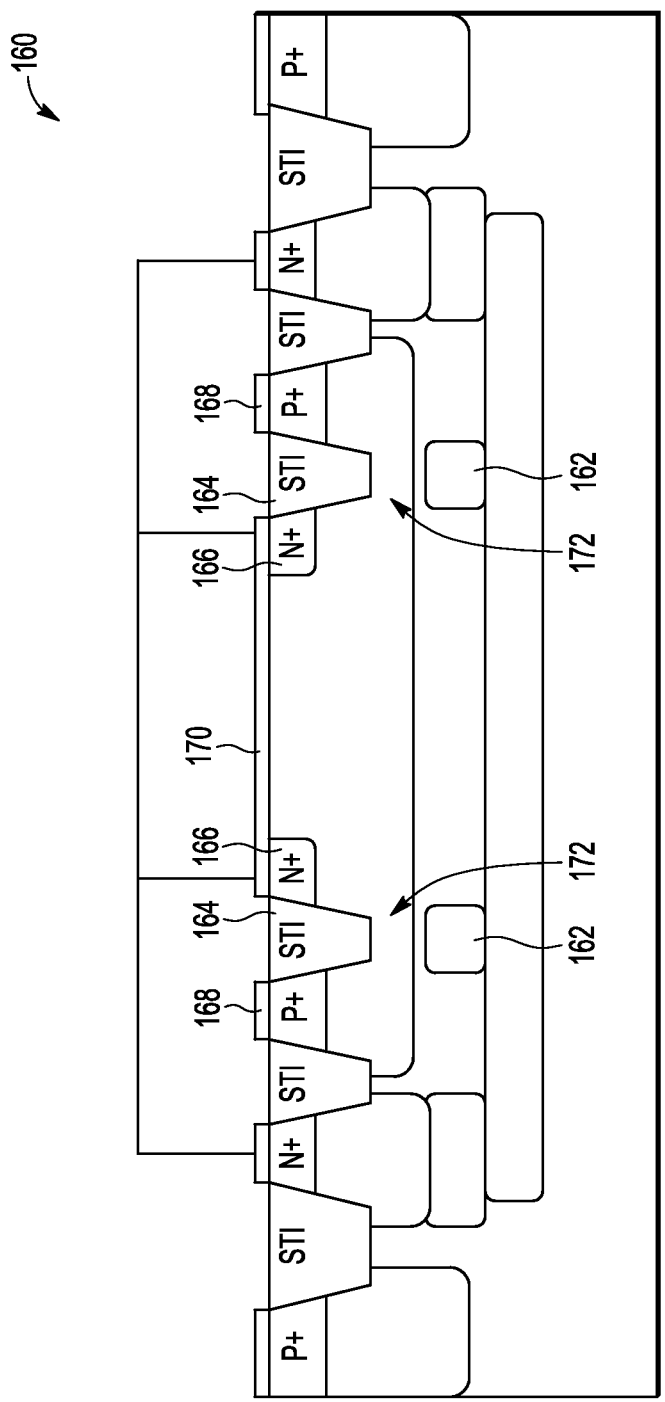

FIG. 7 depicts yet another Schottky diode 160 in which the lateral position of a lower gate structure is modified relative to the above-described embodiments. A buried gate 162 (or arrangement of buried gate islands) is disposed below or under an isolation trench 164, e.g., an STI region. The lateral position of the buried gate 162 is thus offset from an upper gate region 166 adjacent the isolation trench 164. In this example, the offset between the upper gate region 166 and the buried gate 162 disposes the buried gate 162 further outward than the upper gate region 166. The buried gate 162 may be disposed laterally between the upper gate region 166 and an outer electrode 168 adjacent the isolation trench 164.

The conduction path of the Schottky diode 160 between the outer electrode 168 and an inner electrode 170 passes through a conduction path region 172 disposed between the isolation trench 164 and the buried gate 162. With the buried gate 162 directly below or under the isolation trench 164, the conduction path region 172 narrows or necks down at the lateral position of the buried gate 162. As a result, the conduction path region 172 may be extensively depleted at a lower reverse bias voltage. In some cases, the conduction path region 172 may be fully depleted as a result of the p-n junction between the buried gate 172 and the p-type regions in the conduction path region 172 alone. As a result, the upper gate region 166 is optional in some cases.

In any one of the embodiments described herein, the upper gate region 166 may be reconfigured as a set of islands or other discrete regions, or be configured to have an otherwise diminished area in one or both of the lateral dimensions. For example, the upper gate region 166 may be shaped and sized to correspond with the minimum area warranted for a contact landing. In this way, the area for the Schottky barrier may be increased or maximized.

In one or more of the above-described embodiments, the width of the STI region or other isolation trench between the outer and inner electrodes may be configured to achieve a desired conductivity level of the device. Adjusting the trench width may be used to provide another variable in tuning the design of the Schottky diode to reach a desired conductivity level or other operational parameter given, for example, a breakdown voltage or leakage current level.

Figure 8:
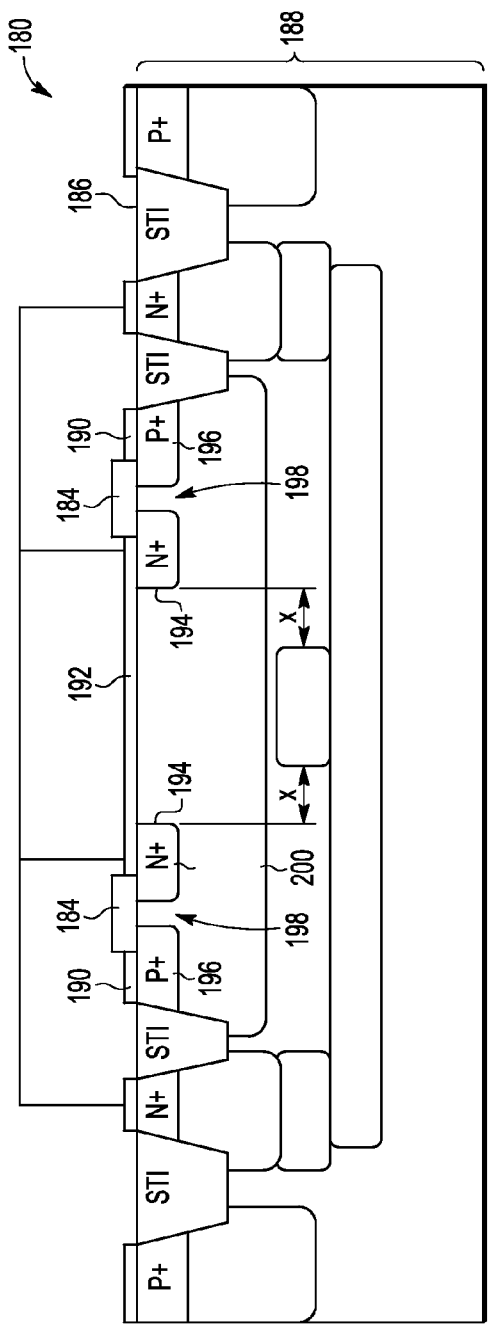
Figure 9:
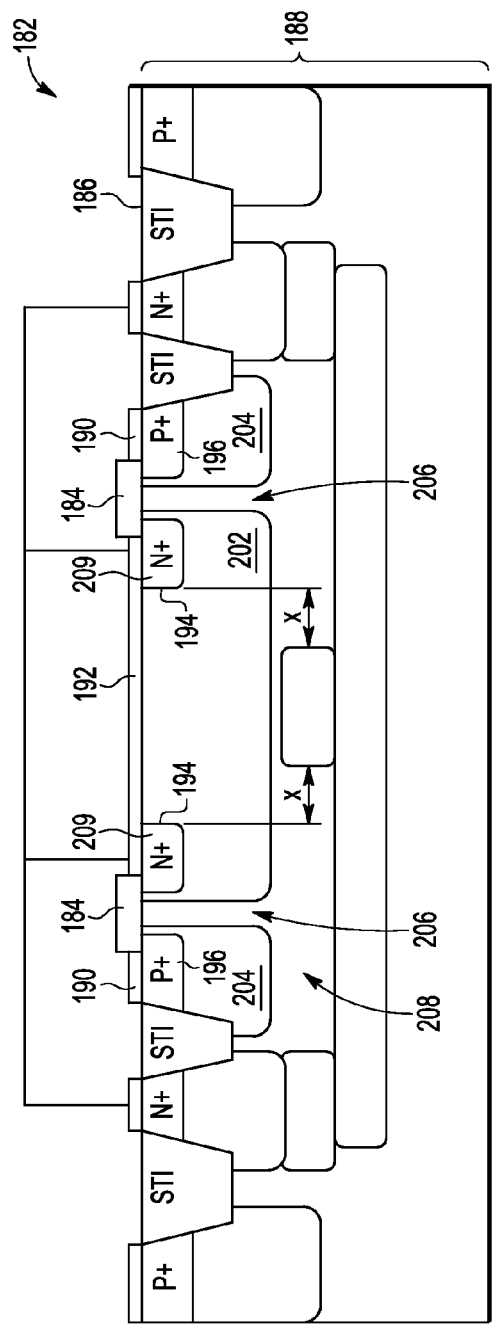

FIGS. 8 and 9 depict further exemplary Schottky diodes 180 and 182 in which the isolation trench is replaced by a silicide block 184 at a surface 186 of a semiconductor substrate 188. The silicide block 184 is disposed between outer and inner electrodes 190 and 192 in each embodiment. The silicide block 184 may be used in lieu of the STI region or other isolation trench to isolate anode and cathode contacts of the Schottky diodes 180, 182. Contact regions 194 and 196 for the outer and inner electrodes 190 and 192 may be separated by a section 198 of a p-type well 200, as shown in FIG. 8.

FIG. 9 shows an alternative embodiment in which the Schottky diode 182 includes inner and outer p-type wells 202 and 204. A lightly (or more lightly) doped p-type region may be disposed between the inner and outer p-type wells 202 and 204. The width and other characteristics of these p-type regions may be configured based on a desired breakdown voltage level for the diode 182. In this example, a section 206 of a p-type epitaxial layer 208 is disposed between the inner and outer p-type wells 202 and 204. The mask for a p-type well implant may be configured to position the inner and outer p-type wells 202 and 204 such that the section 206 of the p-type epitaxial layer 208 is aligned with, and disposed under, the silicide block 184. The patterning of the p-type wells 202 and 204 may configure the Schottky diode 182 with a combination of the p-type well and the p-type epitaxial layer in the conduction path. The combination provides a composite conduction path region that may be configured to provide a lower dopant concentration level in the conduction path and, thus, a higher breakdown voltage level relative to other devices without an isolation trench along the conduction path.

The positioning of the section 206 of the epitaxial layer 208 may vary from the embodiment shown in FIG. 9. For example, the section 206 may be positioned such that an upper gate region 209 of the diode 182 is disposed within, adjacent, or along the section 206. FIG. 10 depicts one example of an upper gate region within the epitaxial layer. In other cases, the upper gate region 209 may laterally overlap, or be partially disposed within, the section 206.

The integrated JFET structures of the disclosed devices may use part of the device isolation tub (or other device isolating structure) as a lower gate region. Another region need not be formed adjacent the isolation tub as described above. This option may be useful in those cases in which the isolation tub (or other device isolating structure) does not include a link or other region linking the sides and bottom of the tub (or other structure).

FIG. 10 depicts one example of a Schottky diode 210 in which a device isolating region is used as a lower gate of an integrated JFET structure. In this example, the device isolating region corresponds with an n-type buried layer 211, which may be similar to the above-described NBL structures. For instance, the buried layer 211 extends laterally across a device area of the Schottky diode 210 to form a bottom of an isolation tub. The isolation tub does not include a link region, but may otherwise be similar to the above-described isolation tubs.

Like the embodiment of FIG. 9, the diode 210 has a composite conduction path region having multiple Schottky diode semiconductor regions of differing dopant concentration level. Unlike the embodiment of FIG. 9, the sections are separated or defined by an isolation trench 212. The composite conduction path region includes an outer p-type well 214 within which a contact region 216 for an outer electrode 218 is disposed. The composite conduction path region further includes an inner p-type well 220 and an epitaxial layer region 222 between the inner and outer wells. The epitaxial layer region 222 has a lower dopant concentration level than the outer and inner wells 214 and 220.

FIG. 11 depicts another example of a device 230 having a device isolating region as a lower gate of an integrated JFET structure. As with the embodiment of FIG. 10, a buried layer 232 is used as the lower gate. The device 230 differs from the above-described embodiments in the configuration of the upper gate. The upper gate is configured as a composite upper gate. In this example, the upper gate includes a contact region 234 and an extension region 236 adjacent the contact region 234. The contact region 234 may be formed via a source/drain implant of a process flow directed to fabricating power or logic FET devices, such as LDMOS or CMOS transistor devices. The extension region 236 may be formed via a source/drain extension implant of the process flow, such as an implant configured to create a lightly doped drain (LDD) region or other transition region for the source or drain regions of the transistor devices. The extension region 236 may be disposed under or below the contact region 234.

The contact and extension regions 234, 236 may have different lateral distributions or widths. In this example, the extension region 236 extends farther inward than the contact region 234. The increased width of the extension region 236 may compensate for the lower dopant concentration level of the extension region 236 to provide a more consistent depletion region under or below the Schottky barrier area of the device 230, e.g., along the upper gates.

The device 230 includes a silicide block 238 to separate an outer electrode 240, e.g., anode, from an inner electrode 242, e.g., cathode. To help prevent breakdown, the device 230 has a composite conduction path region including a lightly doped region 244 between outer and inner wells 246 and 248. The lightly doped region 244 may be a section of an epitaxial layer having a dopant concentration level lower than the wells 246, 248, as described above. In this example, the inner well 248 has a lateral width such that the upper gate extends laterally beyond the inner well 248 and into the lightly doped section 244.

Each of the regions of the disclosed devices may be formed using one or more steps of a process flow directed to fabricating one or more other types of FET devices, such as power or logic FET devices. Masks, implants, or other steps need not be added to the existing process flow. FIGS. 12-15 provide further examples of Schottky diodes that rely on existing process flow implants to form additional regions or device components. The additional regions may be useful for improving or attaining one or more operational characteristics or properties of the Schottky diode, such as breakdown voltage level, conductivity, and leakage current. For example, the additional regions may be used to form an anode region (or other conduction path region of the Schottky diode) having a non-uniform doping profile for improved performance. The examples may have a number of elements or components in common with the above-described examples.

Figure 12:
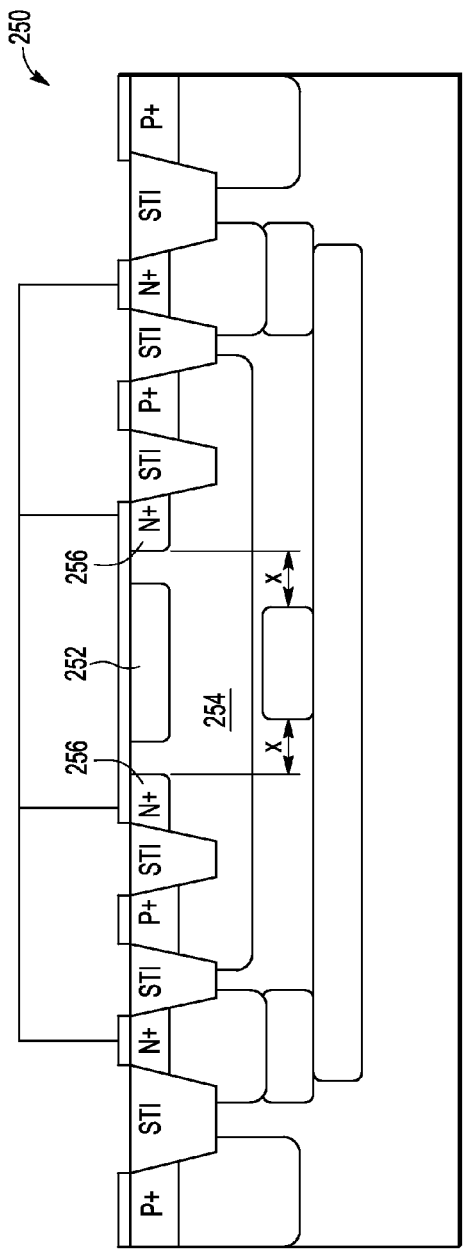

FIG. 12 depicts a Schottky diode 250 having a non-uniform anode region with a p-type transition or extension region 252 disposed within (e.g., adjacent or above) a p-type well region 254. The extension region 252 may be formed with an implant configured to form a drain/source extension region, such as an LDD region. The extension region 252 may thus have a different (e.g., higher) dopant concentration level than the well region 254. In this example, the extension region 252 is formed at the substrate surface in an area centered between strips or other portions of an upper gate region 256. The extension region 252 has a lateral width such that a portion of the well region 254 is disposed between the extension region 252 and the upper gate region 256.

Figure 13:
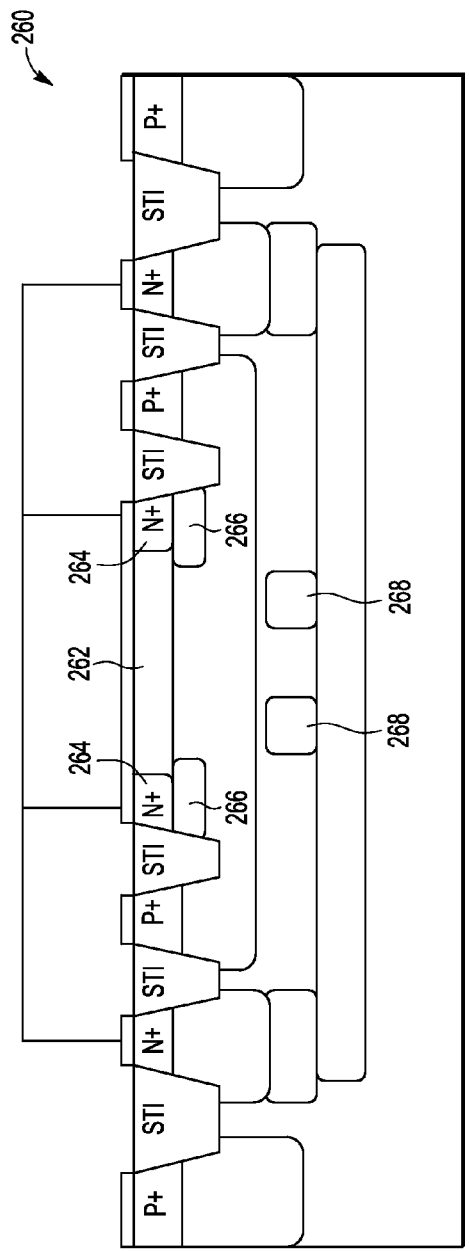

FIG. 13 depicts a Schottky diode 260 in which an extension region 262 extends laterally across the entire width of the Schottky barrier junction. The extension region 262 may thus abut a contact region 264 of an upper gate. In this example, the upper gate includes an extension region 266 adjacent the contact region 264 as described above. This example also includes a ring-shaped lower gate structure 268, which may include a set of islands rather than a uniform strip as described above.

Figure 14:
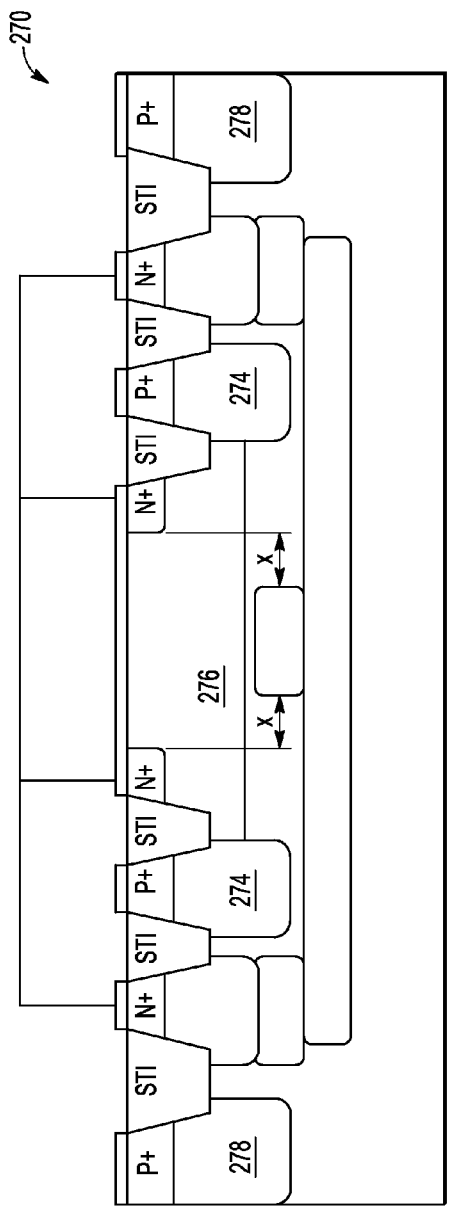
Figure 15:
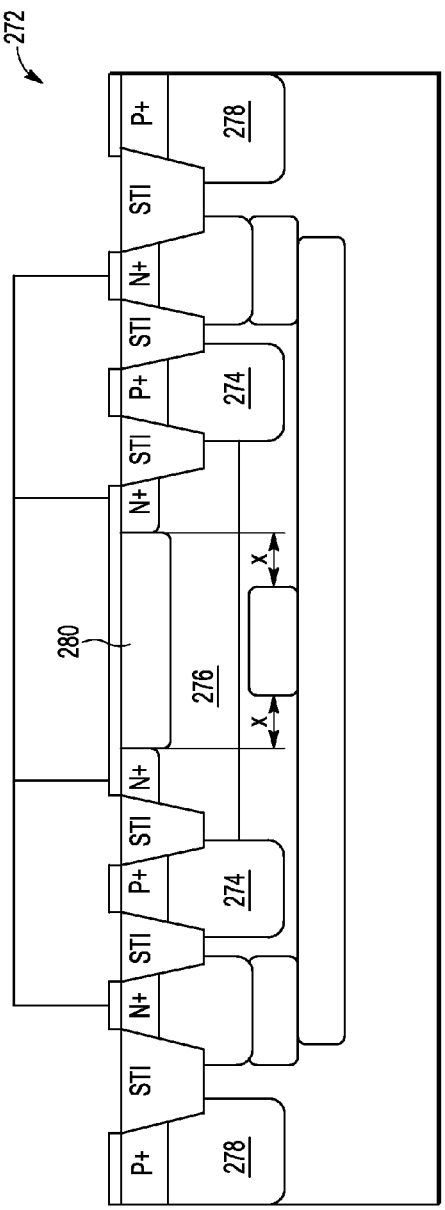

FIGS. 14 and 15 depict Schottky diodes 270 and 272 having multiple p-type wells to form the non-uniform anode region. Each diode 270, 272 includes an outer well region 274 and an inner or central region 276. The inner well region 276 may be formed via an implant directed to fabricating as a p-type well region of a power FET device, such as an LDMOS device. The outer well region 274 may be formed via an implant directed to forming a substrate well 278 for one or more devices. The non-uniform anode region shown in FIG. 15 also includes a transition or extension region 280 at the semiconductor surface.

Figure 16:
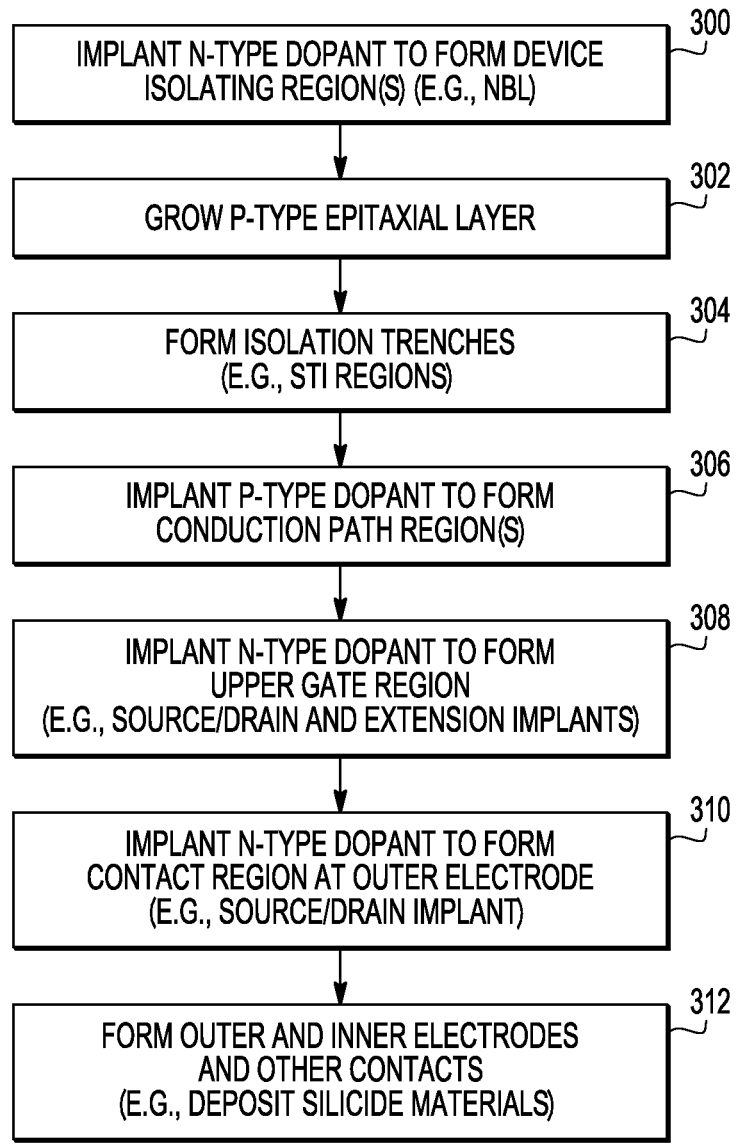
FIG. 16 is a flow diagram of an exemplary fabrication sequence to construct a Schottky diode having an integrated JFET device in accordance with one embodiment.

FIG. 16 shows an exemplary fabrication method for fabricating a Schottky diode with an integrated JFET structure as described above. The Schottky diode is fabricated with a semiconductor substrate, the regions or layers of which may have the conductivity types of the examples described above, or be alternatively configured with the opposite conductivity types. The method includes a sequence of acts or steps, only the salient of which are depicted for convenience in illustration. The ordering of the acts may vary in other embodiments. For example, the implants may be conducted in a different order. Additional, fewer, or alternative steps may be implemented. For example, one or more additional implants may be implemented to form the various sections or components of a non-uniform anode region. Other additional steps may involve the deposition of one or more materials to form various structures, such as a silicide block.

The method may begin with, or include, a step 300 in which one or more other doped device isolating regions are formed in a semiconductor substrate to define the vertical and lateral periphery or boundaries of the Schottky diode. The semiconductor substrate may be an SOI substrate. The semiconductor substrate may include an original p-type semiconductor substrate on which the insulator, epitaxial, or other layers are grown or otherwise formed. In one example, an NBL layer is formed before the growth of the epitaxial layer(s) to achieve a depth that may not be possible or practical via an implantation-based procedure.

In some embodiments, the device isolating regions are formed by an implant procedure. The implant procedure may use a mask configured to form isolation tubs as described above. The implant procedure may be configured to define the lateral periphery or boundaries of other devices, such as various FET devices, formed in the semiconductor substrate. For example, the implant procedure may also define the lateral periphery of an LDMOS device. Alternatively or additionally, the implant procedure may be configured as a logic FET well implant used to form a well region of a logic FET device.

In a step 302, a p-type epitaxial layer (p-epi) is grown on the semiconductor substrate. The epitaxial layer defines a surface of the semiconductor substrate. Any number of epitaxial layers may be grown.

As part of or after the step 302, one or more of device isolating regions (or regions connected thereto) may be formed in the epitaxial layer(s) via corresponding implants. For example, a respective implant may be used to form a ring-shaped well (or sink) or a link region as described above. The implant used to form the link region may use a mask having a layout that also forms a lower gate region of the integrated JFET structure adjacent the buried layer. The implant may thus form both a buried JFET gate region (e.g., under or below a conduction path region) and a link region of a device isolating structure. The mask may be configured to define the lower gate region as a central region, a continuous ring-shaped region, or a ring-shaped or other set of island regions. As described above, the buried JFET gate region need not be formed along with a link region, insofar as an NBL or other buried device isolating layer of the device isolating structure extending across an active area of the Schottky diode to meet the ring-shaped well may be used.

In a step 304, STI regions or other isolation trenches may then be formed at a surface of the semiconductor substrate. The STI regions may be formed via any now known or hereafter developed procedure. For example, the step 304 may include the formation of a trench and the deposition, e.g., chemical vapor deposition, or CVD, of one or more materials in the trench. In some embodiments, the trench is filled with silicon oxide. Additional or alternative materials may be deposited. In an alternative embodiment, the STI regions are formed before one or more of the device isolating regions are formed.

In a step 306, one or more conduction path regions are formed in the semiconductor substrate along a conduction path of the Schottky diode. The step 306 may include conducting a power field-effect transistor (FET) well implant procedure, such as one configured to form a high voltage p-type well region of an LDMOS device. The step 306 may include additional p-type implants to form a composite conduction path region as described above.

An upper gate region of the integrated JFET structure may be formed in a step 308. An implant procedure configured to form a source or drain region of a FET device may be used. The mask for the implant may be configured to also form a contact region for the isolation tub. In some cases, a source/drain extension implant procedure is also conducted to form the upper JFET gate region in the semiconductor substrate.

In a step 310, another implant may be implemented to form a contact region at an outer electrode, such as an anode. The implant may correspond with an implant used to form source/drain or other contact regions of various FET devices. Any number of the implant procedures implemented in the above-described steps may correspond with implants conducted and configured to fabricate regions of FET devices, such as logic FET devices and power FET devices. The disclosed devices may thus be fabricated cost effectively during a process flow configured for one or more FET device designs. The disclosed devices may be fabricated without additional masks or procedures.

Outer and inner electrodes may then be formed in a step 312 via deposition of one or more materials on the substrate surface. The step 312 may include depositing one or more metals to form a silicide for the electrodes. A variety of different silicides may be formed. Other conductive materials may be deposited.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited to establish the above-described connections with the electrodes. Any number of additional STI regions may be formed. The procedures may be implemented in various orders. Additional or alternative procedures may be implemented.

Schottky diodes with an integrated JFET that clamps the conduction path in a diagonal or vertical direction are described above. JFET structures are integrated and disposed in the conduction path of the Schottky diode(s). The JFET bottom gate is integrated with the isolation tub that isolates the anode and other components of the device from the substrate. The bottom gate may be connected with the cathode and top gate through backend metallization. The disclosed devices do not need a third terminal because, for instance, the bottom or lower gate of the JFET structure is integrated with the isolation tub, which, is turn, connected with one of the electrodes, e.g., the cathode. The conduction path may thus be depleted from both the bottom and top in a diagonal or vertical direction under reverse bias. The electrical connection to the bottom gate may be established outside of the Schottky barrier area.

In a first aspect, a device includes a semiconductor substrate, first and second electrodes supported by the semiconductor substrate, laterally spaced from one another, and disposed at a surface of the semiconductor substrate to form an Ohmic contact and a Schottky junction, respectively. The device further includes a conduction path region in the semiconductor substrate, having a first conductivity type, and disposed along a conduction path between the first and second electrodes, a buried region in the semiconductor substrate having a second conductivity type and disposed below the conduction path region, and a device isolating region electrically coupled to the buried region, having the second conductivity type, and defining a lateral boundary of the device. The device isolating region is electrically coupled to the second electrode such that a voltage at the second electrode during operation is applied to the buried region to deplete the conduction path region.

In a second aspect, a Schottky diode includes a semiconductor substrate and first and second electrodes supported by the semiconductor substrate, laterally spaced from one another, and disposed at a surface of the semiconductor substrate to form an Ohmic contact and a Schottky junction, respectively. The Schottky diode further includes a conduction path region in the semiconductor substrate, having a first conductivity type, and disposed along a conduction path between the first and second electrodes. The conduction path region is configured as a channel of an integrated junction field effect transistor (JFET) structure in the semiconductor substrate. The JFET structure includes a buried gate region having a second conductivity type and disposed below the conduction path region, a device isolating region electrically coupled to the buried gate region, having the second conductivity type, and defining a lateral boundary of an active area of the Schottky diode, a buried device isolating layer having the second conductivity type and extending across the active area of the device, and a link region having the second conductivity type, disposed between the device isolating region and the buried device isolating layer, and sharing a common dopant profile with the buried gate region. The device isolating region is electrically coupled to the second electrode such that a voltage at the second electrode during operation is applied to the buried gate region to deplete the conduction path region.

In a third aspect, a method of fabricating a Schottky diode having an integrated junction field-effect transistor (JFET) device includes forming a conduction path region in a semiconductor substrate along a conduction path of the Schottky diode, the conduction path region having a first conductivity type, defining a lateral boundary of an active area of the Schottky diode by forming a well of a device isolating structure in the semiconductor substrate having a second conductivity type, and conducting an implant of dopant of the second conductivity type to form a buried JFET gate region in the semiconductor substrate under the conduction path region. The implant is configured to further form the device isolating structure in which the Schottky diode is disposed.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides, e.g., nitrides, oxy-nitride mixtures, etc. Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a semiconductor substrate;
   first and second electrodes supported by the semiconductor substrate, laterally spaced from one another, and disposed at a surface of the semiconductor substrate to form an Ohmic contact and a Schottky junction, respectively;
   a conduction path region in the semiconductor substrate, having a first conductivity type, and disposed along a conduction path between the first and second electrodes;
   a buried region in the semiconductor substrate having a second conductivity type and disposed below the conduction path region; and
   a device isolating region electrically coupled to the buried region, having the second conductivity type, and defining a lateral boundary of the device;
   wherein the device isolating region is electrically coupled to the second electrode such that a voltage at the second electrode during operation is applied to the buried region to deplete the conduction path region.

2. The device of claim 1, wherein the buried region extends across an active area of the device.

3. The device of claim 1, further comprising:
a buried device isolating layer in the semiconductor substrate, having the second conductivity type, and extending across an active area of the device; and
a link region in the semiconductor substrate having the second conductivity type and disposed between the device isolating region and the buried device isolating layer;
wherein the buried region and the link region have a common dopant profile.

4. The device of claim 1, further comprising an upper junction field effect transistor (JFET) gate region in the semiconductor substrate, having the second conductivity type, and electrically coupled to the second electrode, wherein the buried region is configured as a lower JFET gate region with the conduction path passing between the upper and lower JFET gate regions.

5. The device of claim 4, wherein the upper and lower JFET gate regions are laterally spaced from one another.

6. The device of claim 4, wherein the upper and lower JFET gate regions laterally overlap one another.

7. The device of claim 1, wherein the buried region is one of a plurality of buried islands laterally spaced from one another in the semiconductor substrate, having the second conductivity type, disposed below the conduction path region, and electrically coupled to the second electrode.

8. The device of claim 7, further comprising an isolation trench in the semiconductor substrate adjacent the first electrode, wherein the conduction path region is disposed between the isolation trench and the ring-shaped buried region.

9. The device of claim 1, wherein the buried region is ring-shaped.

10. The device of claim 1, wherein the conduction path region is a first Schottky diode semiconductor region of a plurality of Schottky diode semiconductor regions in the semiconductor substrate, having the first conductivity type, and disposed along the conduction path between the first and second electrodes.

11. The device of claim 10, wherein:
a second Schottky diode semiconductor region of the plurality of Schottky diode semiconductor regions is adjacent the first electrode;
a third Schottky diode semiconductor region of the plurality of Schottky diode semiconductor regions is disposed between the first and second Schottky diode semiconductor regions; and
the third Schottky diode semiconductor region has a lower dopant concentration level than the first and second Schottky diode semiconductor regions.

12. The device of claim 10, wherein:
a second Schottky diode semiconductor region of the plurality of Schottky diode semiconductor regions is adjacent the first electrode; and
the first and second Schottky diode semiconductor regions have different dopant concentration levels.

13. The device of claim 1, wherein the buried region is electrically tied to the second electrode.

14. The device of claim 1, wherein the buried region is electrically tied to the second electrode via the device isolating region.

15. A Schottky diode comprising:
a semiconductor substrate;
first and second electrodes supported by the semiconductor substrate, laterally spaced from one another, and disposed at a surface of the semiconductor substrate to form an Ohmic contact and a Schottky junction, respectively;
a conduction path region in the semiconductor substrate, having a first conductivity type, and disposed along a conduction path between the first and second electrodes;
wherein the conduction path region is configured as a channel of an integrated junction field effect transistor (JFET) structure in the semiconductor substrate, the JFET structure comprising:
a buried gate region having a second conductivity type and disposed below the conduction path region;
a device isolating region electrically coupled to the buried gate region, having the second conductivity type, and defining a lateral boundary of an active area of the Schottky diode;
a buried device isolating layer having the second conductivity type and extending across the active area of the Schottky diode; and
a link region having the second conductivity type, disposed between the device isolating region and the buried device isolating layer, and sharing a common dopant profile with the buried gate region;
wherein the device isolating region is electrically coupled to the second electrode such that a voltage at the second electrode during operation is applied to the buried gate region to deplete the conduction path region.

16. The Schottky diode of claim 15, wherein the JFET structure comprises an upper gate region having the second conductivity type and electrically coupled to the second electrode, wherein the conduction path passes between the upper and buried gate regions.

17. The Schottky diode of claim 15, wherein the buried gate region is one of a plurality of buried gate islands laterally spaced from one another, having the second conductivity type, disposed below the conduction path region, and electrically coupled to the second electrode.

18. The Schottky diode of claim 15, wherein the buried gate region is electrically tied to the second electrode.

19. The Schottky diode of claim 15, wherein the buried gate region is electrically tied to the second electrode via the device isolating region.

* * * * *